United States Patent
Fujita et al.

[11] Patent Number: 5,861,768
[45] Date of Patent: Jan. 19, 1999

[54] RESOLVER EXCITER HAVING A SIMPLE POWER SOURCE UNIT

[75] Inventors: Hiroshi Fujita; Kazuyoshi Obayashi, both of Kariya, Japan

[73] Assignee: Denso Corporation, Kariya, Japan

[21] Appl. No.: 733,739

[22] Filed: Oct. 18, 1996

[30] Foreign Application Priority Data

Oct. 19, 1995 [JP] Japan .................................. 7-271475

[51] Int. Cl.$^6$ .............................. H03L 1/00; H03L 5/00; H03B 11/00
[52] U.S. Cl. ................. 327/129; 318/661; 324/207.25; 327/175; 331/117 FE; 331/165; 331/167
[58] Field of Search ........................ 324/207.15–207.19, 324/207.25; 327/100, 101, 110, 124, 129, 175, 177; 318/656–661; 322/69, 70, 78; 323/355, 358, 359; 363/106, 109; 331/117 R, 117 FE, 165–167, 172, 173, 177 R; 315/219, 223, 276

[56] References Cited

U.S. PATENT DOCUMENTS

| | | | |
|---|---|---|---|
| 2,995,709 | 8/1961 | Beardwood, III et al. | 327/129 |
| 3,085,164 | 4/1963 | Olsson | 327/129 |
| 4,472,661 | 9/1984 | Culver | 315/276 |
| 4,682,090 | 7/1987 | Schmidt et al. | 318/661 |
| 4,761,727 | 8/1988 | Kammiller | 323/358 X |
| 4,980,813 | 12/1990 | Wells | 363/106 X |
| 5,196,776 | 3/1993 | Shipley | 318/661 X |
| 5,304,909 | 4/1994 | Jin et al. | 318/661 |
| 5,438,302 | 8/1995 | Goble | 331/173 X |
| 5,550,498 | 8/1996 | Kwan et al. | 327/175 |

FOREIGN PATENT DOCUMENTS 1-223599  9/1989  Japan .

*Primary Examiner*—Gerard R. Strecker
*Attorney, Agent, or Firm*—Pillsbury Madison & Sutro LLP

[57] ABSTRACT

A resonance circuit includes a capacitor, a coil element and a primary coil of a transformer. A connection between the resonance circuit and a vehicle-mounted battery is connected and disconnected by a switching transistor at a predetermined duty cycle. Output voltage of a secondary coil of the transformer is supplied to an exciting winding of a resolver.

5 Claims, 3 Drawing Sheets

RESOLVER EXCITER HAVING A SIMPLE POWER SOURCE UNIT

CROSS-REFERENCE TO RELATED APPLICATION

This application is related to and claims priority from Japanese Patent Application No. Hei-7-271475, the contents of which are hereby incorporated by reference.

BACKGROUND OF THE INVENTION

1. Field of the Invention

The present invention relates to a resolver exciter for providing alternating current power to an exciting winding of a resolver.

2. Description of Related Art

A resolver, which includes a stationary exciting winding and a rotating output winding, produces an output voltage in accordance with an angle of rotation of its output winding. The resolver is commonly used in various control devices for detecting angle of rotation.

Normally, a 7 KHz alternating current signal of about 20–30 V must be provided to the exciting winding to drive the resolver. Conventional resolver exciters include a sine wave oscillator, which uses operational amplifiers and the like, and a line driver circuit for amplifying the resulting sine wave oscillating signal and for providing the amplified signal to the exciting winding.

Moreover, when the resolver exciter is to be installed in a vehicle, there is a need to provide a DC/DC converter for boosting the rated voltage (approximately 12 V) of a vehicle-mounted battery to the necessary voltage level.

Meanwhile, as shown in FIG. 3, U.S. Pat. No. 5,304,909 discloses a resolver exciter which includes a sine wave oscillator IC 71, a low-pass filter 72 for filtering the oscillating signal of the IC 71 and a push-pull type line driver circuit 73 for amplifying the filtered signal and for providing the amplified signal to the exciting winding of the resolver.

However, one problem with the above-described conventional resolver exciters is with regards to their costs because they need relatively complicated sine wave oscillators and line driver circuits.

While the device disclosed in U.S. Pat. No. 5,304,909 has a reduced size and a simple circuit construction because of its use of the sine wave oscillating IC, reduction in costs is minimal because this device needs a line driver circuit and a power source for driving the same line driver circuit.

SUMMARY OF THE INVENTION

In view of the foregoing problems of the prior art in mind, one object of the present invention is to provide a low cost resolver exciter having a simple circuit construction. In particular, it is an object of the present invention to provide a resolver exciter that has a simple power source circuit.

To achieve the foregoing objects, one aspect of the present invention provides a resolver exciter for actuating a resolver which includes an exciting winding. The resolver exciter includes a direct current source, a resonance circuit and a switching unit. The resonance circuit is connected to the direct current source and is for providing an output voltage to the exciting winding. This resonance circuit includes a capacitor and a coil unit. The switching unit is for connecting and disconnecting the resonance circuit to and from the direct current source at a predetermined duty cycle.

In this way, the resonance circuit produces a sine wave signal which is provided to the exciting winding. In this way, complicated sine wave oscillators can be done away with. Also, because the electric power supply capacity of the resonance circuit can be easily enlarged, there will be no need for the line driver circuit if the output impedance of the resonance circuit is reduced. Thus, the construction of the resolver exciter can be made simple and its costs can be reduced.

Preferably, a transformer is provided whose primary coil is a part of the resonance circuit and whose secondary coil is connected to the exciting winding of the resolver. In this way, using the transformer, the output of the resonance circuit can be boosted to a level sufficient to drive the resolver and thus, there will be no need to provide a DC/DC converter.

Preferably, the secondary coil of the transformer is connected to the switching unit. In this way, the level of output signal to the exciting winding of the resolver can be monitored and maintained independent of factors such as battery voltage fluctuation and the like.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF PRESENTLY PREFERRED EXEMPLARY EMBODIMENTS

Preferred embodiments of the present invention are described hereinafter with reference to the accompanying drawings.

Figure 1:
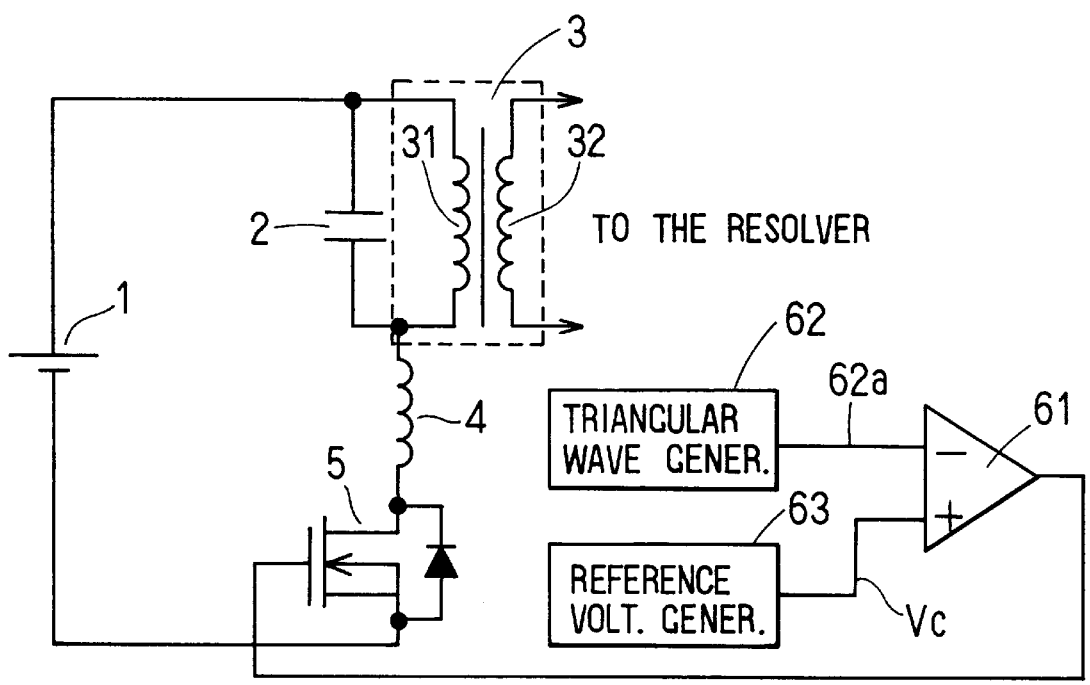
FIG. 1 is a circuit diagram of a resolver exciter according to a first embodiment of the present invention.

FIG. 1 shows a construction of a resolver exciter according to a first embodiment of the present invention. In this FIG. 1, a vehicle-mounted battery 1 of a predetermined rated voltage (e.g., 12 V) is connected in series with a capacitor 2, a coil element 4 (which may be an inductor) and a MOS-type switching transistor 5 (hereinafter simply referred to as transistor).

A transformer 3 is also provided with its primary coil 31 connected in parallel with the capacitor 2 and its secondary coil 32 connected to an exciting winding of a resolver (not shown). The capacitor 2, the coil element 4 and the primary coil 31 form a resonance circuit that has a predetermined resonance frequency of approximately 7 KHz.

A gate of the transistor 5 is connected to an output terminal of an op-amp 61 while a noninverting input terminal of the op-amp 61 is connected to a reference voltage generator 63 which provides it with a reference voltage Vc. A triangular wave output signal 62a of a triangular wave generator 62 is provided to an inverting input terminal of the same op-amp 61. The frequency of the triangular wave signal 62a generated by the triangular wave generator 62 is equal to the resonance frequency described above. It must be noted here that the reference voltage Vc generated by the reference voltage generator 63 is set to be within the voltage range of the triangular wave signal 62a.

When the voltage of the triangular wave signal 62a becomes less than the reference voltage Vc, the output signal of the comparator 61 becomes high and so, the transistor 5 is switched to a conductive state. Conversely, when the voltage of the triangular wave signal 62a becomes more than the reference voltage Vc, the output signal of the comparator 61 becomes low and so, the transistor 5 is switched to a nonconductive state.

In this way, the transistor 5 becomes conductive at the same frequency as that of the triangular wave 62a at a predetermined duty cycle determined based on the reference voltage Vc. In this case, the higher the reference voltage Vc is set, the larger the duty cycle becomes and the lower the reference voltage Vc is set, the smaller the duty cycle becomes.

With the transistor 5 switching at a predetermined duty cycle, a sinusoidal oscillating wave is produced in the resonance circuit. This sinusoidal oscillating wave is boosted to a certain level (for example, 20 V) by the transformer 3 and then provided to the exciting winding of the resolver from the secondary coil 32. It must be noted here that the amplitude of the boosted sinusoidal oscillating wave can be adjusted by adjusting the reference voltage Vc to change the duty cycle of the transistor 5.

In this way, according to the present embodiment, a sinusoidal wave can be produced from a direct current signal using a resonance circuit having a simple construction which includes the capacitor 2, the primary coil 31 and the coil element 4.

Also, because the sinusoidal wave can be boosted by the transformer 3 which is a part of the resonance circuit, there will be no need for the DC/DC converter used in conventional devices.

Furthermore, the adjustment of the coil radius of the coil 32 and the minimization of its output impedance enables the supply of a sufficient amount of electric current to the exciting winding of the resolver and thus, there will be no need for the line driver circuit.

Therefore, there will be no need for a separate power source for driving the line driver circuit and thus, the resolver exciter can be formed to have a simple construction and at a low cost. Moreover, the overall electrical conversion efficiency of the resolver exciter according to the present embodiment will be better than that of conventional devices.

Meanwhile, it must be noted here that the coil element 4 connected in series with the capacitor 2 can be done away with if a predetermined resonance impedance can be set in the resonance circuit. Also, the primary coil 31 may be connected in series with the capacitor 2.

Also, the resonance circuit may be connected directly to the exciting winding of the resolver and the transformer 3 may be done away with when the output impedance to the exciting winding is substantially low and when the battery voltage level is substantially high (for example, 24 V).

Figure 2:
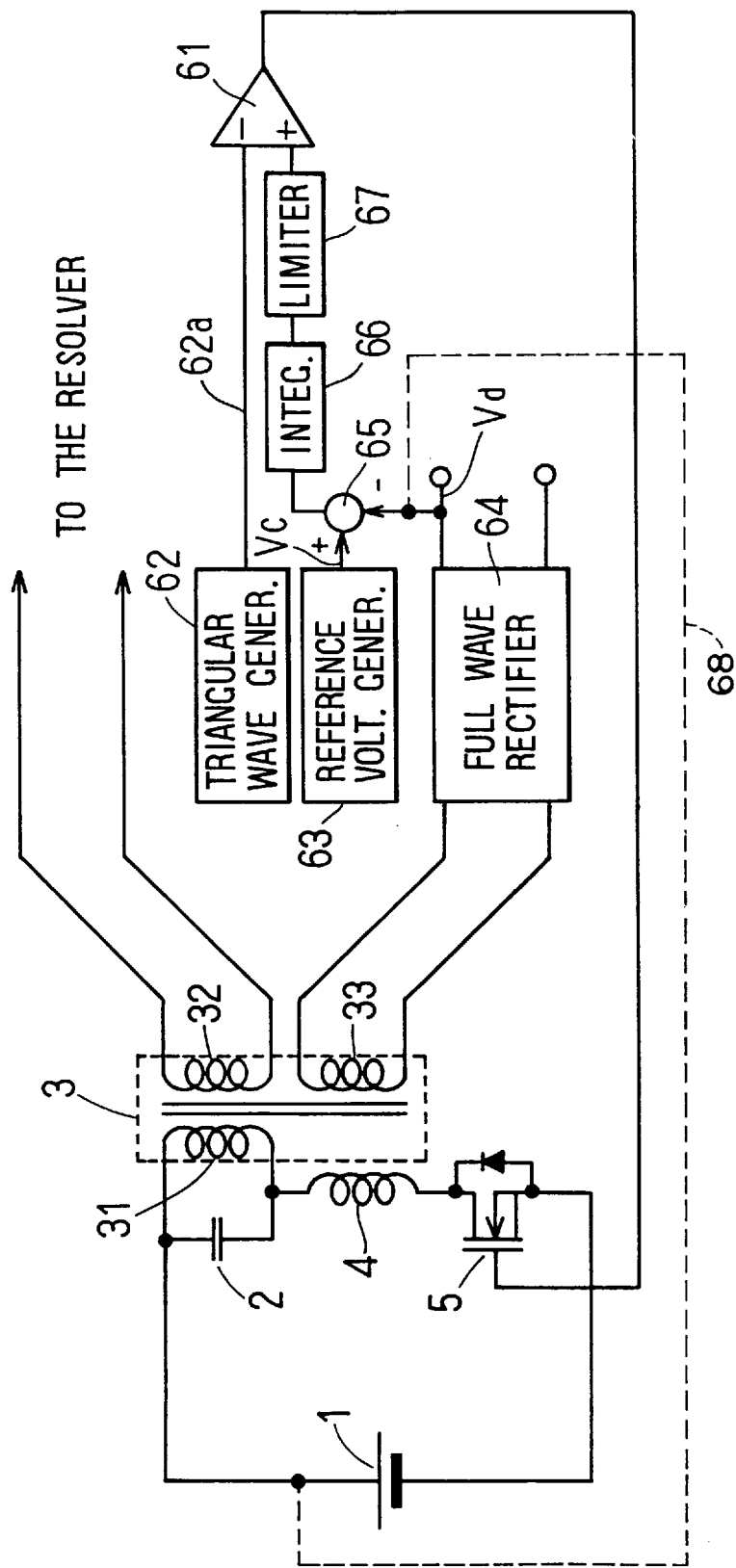
FIG. 2 is a circuit diagram of the resolver exciter according to a second embodiment of the present invention.
Figure 3:
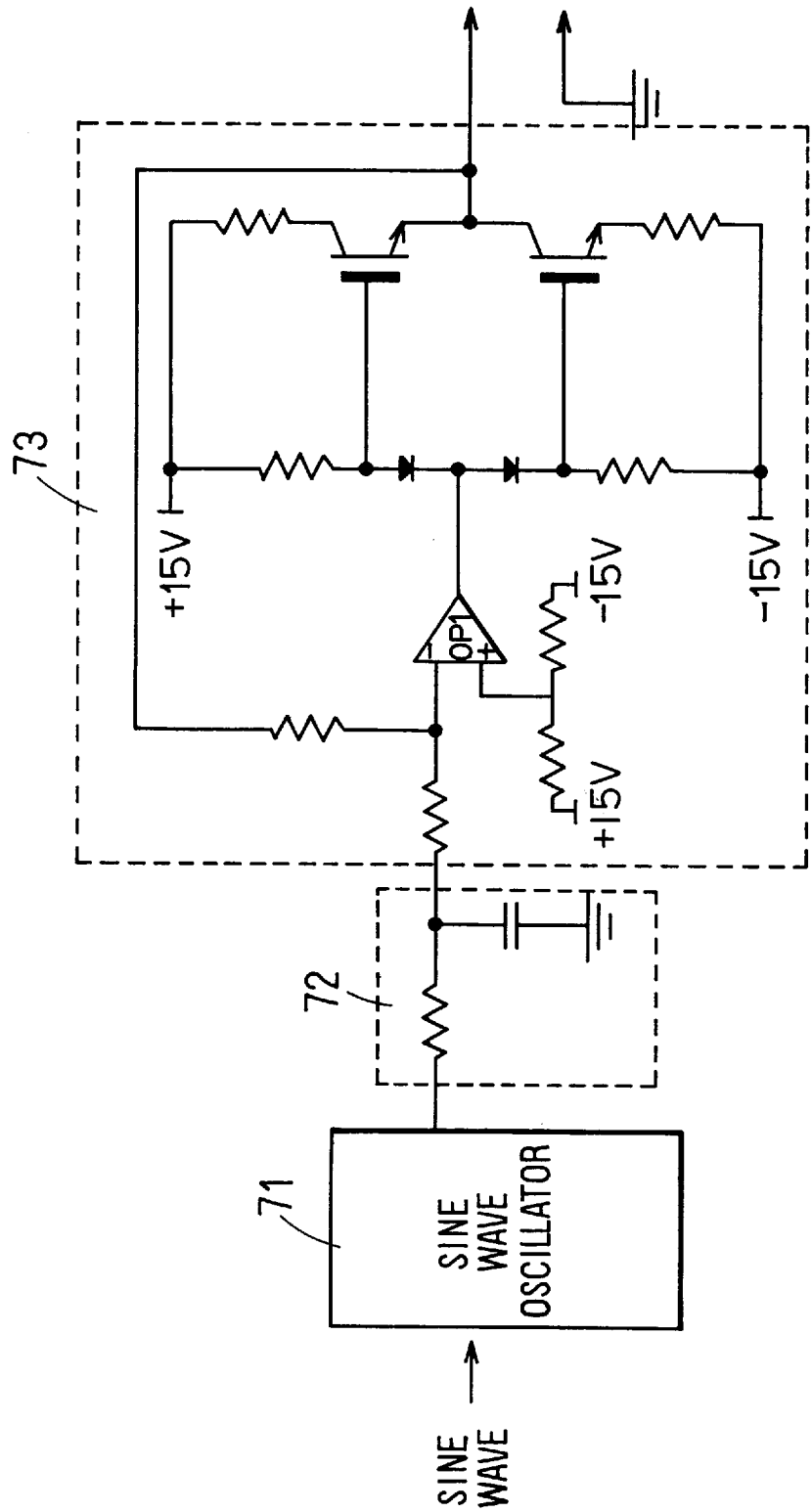
FIG. 3 is a circuit diagram of a conventional resolver exciter.

While it has been explained before that the voltage level of the boosted sinusoidal wave oscillating signal (i.e., the voltage signal applied to the exciting winding of the resolver) can be adjusted based on the reference voltage Vc of the reference voltage generator 63, FIG. 2 shows a second embodiment of the present invention which can reliably perform such voltage level adjustment.

As shown in FIG. 2, the transformer 3 is provided with two secondary coils 32, 33 with one secondary coil 32 connected to the resolver and the other secondary coil 33 connected to a full wave rectifier 64. A full wave rectified direct current voltage Vd is provided to a differential amplifier 65 which generates the difference between the rectified signal and the reference voltage Vc. The resulting difference signal is provided to a limiter 67 via a proportional integrator 66. The output signal of the limiter 67 is provided to a comparator 61 which compares it with the triangular wave signal 62a.

It must be noted here that the limiter 67 is for preventing the output voltage of the proportional integrator 66 from becoming higher than the triangular wave signal 62a when the resolver exciter is actuated. Thus, the limiter 67 prevents the comparator 61 from generating a high level output signal when the resolver exciter is actuated.

According to the present embodiment, the voltage in the secondary coil 33, which is proportional to the actual voltage applied to the resolver, is fed back via the full wave rectifier 64 and thus, the duty cycle of the transistor 5 is controlled so that the feedback voltage Vd equals the reference voltage Vc. In this way, the voltage signal applied to the resolver can be appropriately maintained despite of disturbances such as battery voltage fluctuation and the like.

Also, because the output voltage of the secondary coil 33 of the transformer 3 is being monitored, precise sinusoidal wave signals can always be obtained independent of the voltage conversion characteristics of the transformer 3. Meanwhile, while the output voltage of the secondary coil 33 of the transformer 3 is being fed back via the full wave rectifier 64, the duty cycle of the transistor 5 may also be controlled by monitoring fluctuations in the voltage level of the battery 1 as shown by a broken line 68 or the level of current flowing in the transistor 5. In this way, accurate sinusoidal signals independent of fluctuations in the voltage level of the battery 1 can be obtained.

Although the present invention has been fully described in connection with preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A resolver exciter for actuating a resolver, comprising:
   a direct current source;
   a resonance circuit for providing a resonant frequency, said resonance circuit including a transformer having a primary coil connected to said direct current source and a secondary coil for supplying output voltage to said resolver, a capacitor connected in parallel with said primary coil and an impedance adjustment inductor connected in series with said primary coil;
   switching means having a gate terminal and connected between said direct current source and said primary coil;
   a reference voltage generator for providing a reference voltage;
   switch control means for controlling said switching means to change a duty cycle of current supplied to said primary coil, said switch control means including a comparator having an output terminal connected to said gate terminal and first and second input terminals and a triangular wave signal generator connected to said first input terminal of said comparator; and
   regulation means, connected between said reference voltage generator and said second input terminal of said comparator, for maintaining said output voltage of said secondary coil at a constant shape by adjusting said duty cycle, wherein
   said regulation means comprises:

a monitoring coil disposed in said transformer for providing a voltage signal related to said output voltage of said secondary coil;

difference detecting means having input terminals connected to said monitoring coil and said reference voltage and an output terminal connected to said second input terminal of said comparator, wherein said difference detecting means supplies an output signal relative to a difference between said voltage signal of said monitoring coil and said reference voltage to adjust said duty cycle so that said voltage signal of said monitoring coil can equal said reference voltage.

2. A resolver exciter according to claim 1, wherein the frequency of the triangular wave signal generated by said triangular wave signal generator is equal to said resonant frequency.

3. A resolver exciter according to claim 2, wherein said regulation means further comprises a limiter for preventing said comparator from generating an excessively high voltage.

4. A resolver exciter according to claim 1, wherein said switching means comprises a MOSFET.

5. A resolver exciter for actuating a resolver, comprising:

a direct current source;

a resonance circuit for providing a resonant frequency, said resonance circuit including a transformer having a primary coil connected to said direct current source and a secondary coil for supplying output voltage to said resolver, a capacitor connected in parallel with said primary coil and an impedance adjustment inductor connected in series with said primary coil;

switching means having a gate terminal and connected between said direct current source and said primary coil;

a reference voltage generator for providing a reference voltage;

switch control means for controlling said switching means to change a duty cycle of current supplied to said primary coil, said switch control means including a comparator having an output terminal connected to said gate terminal and first and second input terminals and a triangular wave signal generator connected to said first input terminal of said comparator; and regulation means, connected between said reference voltage generator and said second input terminal of said comparator, for maintaining said output voltage of said secondary coil at a constant shape by adjusting said duty cycle, wherein said regulation means comprises:

fluctuation monitoring means for providing a voltage signal relative to fluctuation in said direct current source; and difference detecting means having input terminals connected to said fluctuation monitoring means and said reference voltage generator and an output terminal connected to said second input terminal of said comparator, wherein said difference detecting means supplies an output signal relative to a difference between said voltage signal of said fluctuation monitoring means and said reference voltage.

* * * * *